United States Patent [19]
Zou et al.

[11] Patent Number: 5,610,521
[45] Date of Patent: Mar. 11, 1997

[54] GRADIENT AND RF COIL SYSTEM WITHOUT RF SHIELD

[75] Inventors: Xueming Zou, Willoughby; John L. Patrick, Chagrin Falls; Nicholas J. Mastandrea, Bedford Hts., all of Ohio

[73] Assignee: Picker International, Inc., Highland Heights, Ohio

[21] Appl. No.: 529,360

[22] Filed: Sep. 18, 1995

Related U.S. Application Data

[63] Continuation of Ser. No. 922,162, Jul. 29, 1992, abandoned, which is a continuation-in-part of Ser. No. 919,215, Jul. 24, 1992, Pat. No. 5,280,248.

[51] Int. Cl.$^6$ ................................................ G01R 33/28
[52] U.S. Cl. ............................................ 324/318; 324/322
[58] Field of Search .................................... 324/318, 322, 324/300, 316, 309, 307; 128/653.5

[56] References Cited

U.S. PATENT DOCUMENTS

| | | | |
|---|---|---|---|
| 4,297,637 | 10/1981 | Crooks et al. | 324/309 |
| 4,468,622 | 8/1984 | Frese et al. | 324/319 |
| 4,486,711 | 12/1984 | Frese et al. | 324/319 |
| 4,617,516 | 10/1986 | Schenck | 324/318 |
| 4,626,784 | 12/1986 | Sepponen | 324/309 |

(List continued on next page.)

FOREIGN PATENT DOCUMENTS

| | | |
|---|---|---|
| 10073399 | 8/1982 | European Pat. Off. . |
| 10073402 | 3/1983 | European Pat. Off. . |
| 20151726 | 8/1985 | European Pat. Off. . |
| 20217520 | 8/1987 | European Pat. Off. . |
| 10317853 | 11/1988 | European Pat. Off. . |
| 20356182 | 2/1990 | European Pat. Off. . |
| 13336694 | 11/1982 | Germany . |
| 13828718 | 4/1984 | Germany . |
| 14032707 | 3/1989 | Germany . |
| 2180943 | 4/1987 | United Kingdom . |

OTHER PUBLICATIONS

Active Magnetic Screening of Gradient Coils in NMR Imaging, Mansfield, et al. J. Mag Res., 66, pp. 573–576 (1986).

Minimum Inductance Coils, R. Turner, J. Phys. E. Sci. Inst. 21, pp. 948–952 (1988).

Gradient Coil Design for Microscope Imaging of Human Extremities in a One Meter Bore Magnet, Barlow p. 132 (1988).

Theory and Application of Mathieu Functions, N.W. McLachlan, Dover Pub. pp. 170–177 (1964).

Active Magnetic Screening of Coils for Static and Time–Dependent Magnetic Field Generation in NMR Imaging, Mansfield, et al. J. Phys. E. Sci. Inst. (1986).

(List continued on next page.)

*Primary Examiner*—Sandra L. O'Shea
*Assistant Examiner*—Raymond Y. Mah
*Attorney, Agent, or Firm*—Fay, Sharpe, Beall, Fagan, Minnich & McKee

[57] ABSTRACT

A superconducting magnet (10) generates a uniform, static magnetic field through a central bore (12) along its longitudinal or z-axis. An insertable coil assembly (40) is inserted into the bore with a radio frequency shield (76, 84) for providing a radio frequency shield between the insertable coil assembly and a surrounding, whole body radio frequency coil assembly (32) and a whole body gradient magnetic field coil assembly (30). The insertable coil includes a gradient coil (44a) including conductors (52) mounted on a dielectric former (50) with a dielectric constant below 4.0. The conductors are relatively narrow and spaced relatively far apart to minimize capacitive coupling with a closely adjacent insertable radio frequency coil (70a). Filters (60, 64) are connected with the conductors of the gradient coil to prevent the gradient coil conductors from supporting radio frequency signals while permitting ready support of kHz frequency currents. An RF filter (106) connected between the insertable gradient coil and an insertable gradient coil control (100) prevents induced radio frequency signals from being transmitted to the insertable gradient coil.

23 Claims, 4 Drawing Sheets

U.S. PATENT DOCUMENTS

| | | |
|---|---|---|
| 4,638,253 | 1/1987 | Jaskolski et al. ................. 324/318 |
| 4,642,569 | 2/1987 | Hayes et al. ..................... 324/318 |
| 4,646,024 | 2/1987 | Schenck et al. .................. 324/318 |
| 4,680,548 | 7/1987 | Edelstein et al. ................ 324/318 |
| 4,692,705 | 9/1987 | Hayes ............................. 324/318 |
| 4,737,716 | 4/1988 | Roemer et al. ................... 324/319 |
| 4,791,370 | 12/1988 | MacKinnon ...................... 324/318 |
| 4,794,338 | 12/1988 | Roemer et al. ..................... 324/39 |
| 4,820,985 | 4/1989 | Eash ............................... 324/318 |
| 4,820,988 | 4/1989 | Crooks ............................ 324/318 |
| 4,829,252 | 5/1989 | Kaufman .......................... 324/309 |
| 4,871,968 | 10/1989 | Kanayama ........................ 324/318 |
| 4,879,515 | 11/1989 | Roemer et al. ................... 324/318 |
| 4,881,035 | 11/1989 | Siebold ............................ 324/320 |
| 4,893,083 | 1/1990 | Overweg et al. .................. 324/318 |
| 4,910,462 | 3/1990 | Roemer ............................ 324/318 |
| 4,924,194 | 5/1990 | Yoda ............................... 324/318 |
| 4,926,125 | 5/1990 | Roemer ............................ 324/318 |
| 5,036,282 | 7/1991 | Morich et al. .................... 324/318 |
| 5,079,503 | 1/1992 | Siebold et al. ................... 324/309 |
| 5,200,703 | 4/1993 | Popp et al. ....................... 324/322 |

OTHER PUBLICATIONS

Real–Time Movie Imaging from a Single Cardiac Cycle by NMR, Chapman, et al. Mag. Res. In Med. 5 pp. 246–254, (1987).

A New Method of Gradient Coil Design in MRI by Fujita, et al. p. 27 (1988).

An Optimized Highly Homogeneous Shielded Gradient Coil Design, Carlson p. 28 (1988).

Design Data for Efficient Axial Gradient Coils: Application to NMR Imaging St. James, et al. Mag. Res. in Med. 2, pp. 245–252 (1985).

Self–Shielded Gradient Coil Design via Eddy Current Modeling, F. Goldie, p. 120. (1995).

Passive Screening of Switched Magnetic Field Gradients, R. Turner, et al. J. Phys. E. Scien. Inst. 19, pp. 876–879, (1986).

Coils Producing a Magnetic Field Gradient for Diffusion Measurements with NMR, Zupancic, et al. J. Phy. E. Sci. Inst. vol. 9 (1976).

"Insertable Biplanar Gradient Coils For Magnetic Resonance Imaging", Martens, et al., Rev. Sci. Instrum. 62 (11), (Nov. 1991), pp. 2639–2645.

Magnetic Field Gradient Coils for NMR Imaging, Bangert, et al. J. Phys. E. Sci. Inst. vol. 15 (1982).

A Target Field Approach to Optimal Coil Design, R. Turner, J. Phys. D. Appl. Phys. 19, pp. L147–151, (1986).

High Speed, High Field, Planar Surface Gradient Assembly for Fast Imaging Roemer, et al. p. 134 (1988).

"Radio Frequency Coils", Hayes, et al., pp. 142–165 (1985) NMR in Medicine: The Instrumentation and Clinical Applications.

A Finite Element Fourier Expansion Technique for the Design of a Pulsed Radial Gradient System for Magnetic Resonance Imaging (MRI), Pillsbury, et al Trans. of Mag. vol. MAG21, No. 6, (Nov. 1985) pp. 2273–2275.

GRADIENT AND RF COIL SYSTEM WITHOUT RF SHIELD

This application is a continuation of U.S. application Ser. No. 07/922,162, filed Jul. 29, 1992 abandoned, which is a continuation-in-part of U.S. application Ser. No. 07/919,215, filed Jul. 24, 1992, U.S. Pat. No. 5,280,248.

BACKGROUND OF THE INVENTION

The present invention relates to the magnetic resonance arts. It finds particular application in conjunction with medical magnetic resonance imaging systems and will be described with particular reference thereto. It is to be appreciated, however, that the invention will also find application in conjunction with other types of magnetic resonance imaging systems, magnetic resonance spectroscopy systems, and the like.

In magnetic resonance imaging, a strong uniform static magnetic field $B_0$ is generated, often by a superconducting magnet. This static magnetic field $B_0$ polarizes the nuclear spin system of an object to be imaged. Superconducting magnets are commonly wound on a cylindrical body former mounted in an annular helium vessel surrounded by an annular vacuum vessel for thermal isolation. The superconducting magnet generates the static magnetic field, $B_0$ along its own longitudinal axis and the common longitudinal axis of the cylindrical bore of the vacuum vessel, commonly denoted as the "z-axis".

To generate a magnetic resonance signal, the polarized spin system is first excited by a radio frequency magnetic field perpendicular to the z-axis. This RF field, denoted $B_1$, is produced by an RF coil located inside the bore of the magnet and closely conforming thereto to maximize the space available to receive a patient. The RF magnetic field, which is changing in time in a sinusoidal waveform, is turned on and off to create short RF pulses to excite magnetization in the polarized object in the bore. More specifically, the RF pulses tip the magnetization out of alignment with the z-axis and cause its macroscopic magnetic moment vector to precess around the z-axis. The precessing magnetic moment, in turn, generates a radio frequency magnetic resonance signal that is received by the RF coil in a reception mode.

In magnetic resonance imaging, it is advantageous for the RF coil to have high sensitivity, high RF power efficiency, and a high signal-to-noise ratio. Also, the $B_1$ magnetic field which it generates should be uniform. The sensitivity of the RF coil is defined as the magnetic field $B_1$ created by a unit current. The signal-to-noise ratio is proportional to the sensitivity and to the square root of the coil quality factor Q.

To encode a sample spatially, magnetic field gradient pulses are applied after the RF excitation. The gradient magnetic fields are also applied in pulses to generate magnetic fields pointing in the z-axis, but changing in magnitude linearly in x, y, or z-directions. These gradient pulses are commonly denoted as $G_x$, $G_y$, and $G_z$ pulses, respectively. The gradient magnetic fields are generated by gradient magnetic field coils which are also located inside the magnet bore. Commonly, the gradient field coils are mounted on a cylindrical former around an outer periphery of the RF coil.

The whole body RF and gradient field coils have a sufficient inner diameter to receive the entire body of a patient within their circular bore. In order to receive a patient's body axially therethrough, the cylindrical whole body coils are relatively large in diameter, e.g. 60 cm. This large diameter tends to place the RF coils a significant distance from individual organs or small regions of the chest cavity to be examined. To overcome the signal-to-noise ratio and sensitivity problems inherent in this large spatial separation, surface coils are often used to receive magnetic resonance signals for individual organ examinations.

In order to optimize gradient performance, it is advantageous to place the gradient coils as close to the patient, hence as close to the RF coil, as possible without limiting patient accessible volume.

One of the problems in conventional magnetic resonance systems is that the radio frequency coil tends to couple with the gradient field coils. That is, the signals from the radio frequency coils induce analogous currents in the gradient coils. To eliminate this coupling, a shield coil is normally inserted between the gradient coil and the RF coil.

However, shield coils reduce the sensitivity of the RF coil. More specifically, secondary RF currents are induced in the shield during RF transmission. The induced secondary currents not only generate RF signals that tend to cancel the $B_1$ field inside the coil, but also consume RF energy due to shield resistance. This lowers the unloaded coil Q factor. The secondary currents in the RF shield degrade the homogeneity of the primary $B_1$ field generated by the RF coil. The closer the RF coil is to its shield, the more the coil sensitivity is reduced.

In order to counteract the negative effects of the shield coil, more RF power is supplied to the RF coil. Supplying more RF power requires larger, more costly power amplifiers and power transmission subsystems.

In order to achieve faster imaging, such as echo planar imaging, larger magnetic field gradients, which are applied for shorter periods of time, are needed. For example, echo planar imaging typically requires gradient magnetic fields on the order of 40 milliTesla per meter in pulses of 80 microsecond duration. This much higher spatial magnetic energy density, as compared to standard magnetic resonance imaging techniques, requires either more power to the gradient coil, or smaller gradient coils. Reducing the diameter of the gradient coil, of course, moves it closer to the RF coil and moves the RF shield therebetween closer to the RF coil. Again, placing the RF shield closer to the RF coil reduces the RF coil sensitivity, its power efficiency, and its signal-to-noise ratio. The power requirements for performing echo planar and other fast scanning techniques is a major impediment in adapting existing magnetic resonance scanner apparatus to perform fast scanning.

Another disadvantage of magnetic resonance imaging apparatus which incorporates RF shields resides in the high cost of such shields. The RF shields are typically etched from double-sided copper laminates which have low loss, high dielectric constant substrates. These high dielectric constant substrate laminates cost a few thousand dollars per MRI system.

The present invention contemplates a new and improved magnetic resonance apparatus which overcomes the above-referenced disadvantages by eliminating RF shielding coils between the RF and gradient coils.

SUMMARY OF THE INVENTION

In accordance with the present invention, a magnetic resonance imaging system is provided in which the gradient and RF coils are disposed closely adjacent, but without an intervening RF shield.

In accordance with one aspect of the present invention, the gradient magnetic field coil is constructed to have a high impedance relative to radio frequency signals and a low impedance relative to signals in the 0–10 kHz range of gradient field current pulses.

In accordance with a more limited aspect of the present invention, filter circuits are provided which enable the gradient current to pass kHz range gradient signals and block the passage of MHz range signals.

In accordance with one yet more limited aspect of the present invention, the filter means include parallel resonance tank circuits connected at intervals within the gradient coil to block the passage of MHz frequency signals. In another embodiment, the filter circuits include high pass filters connected between the gradient field coil and ground to short MHz frequency signals to ground, while confining kHz range frequencies to the gradient coil.

In accordance with another aspect of the present invention, capacitive coupling between the gradient and RF coils is reduced. The gradient coil is made of conductors which present a relatively narrow profile to the RF signal with relatively large gaps or RF windows therebetween. The gradient coil is mounted on a dielectric former with a low dielectric constant, below 4.0.

In accordance with another aspect of the present invention, conventional fixed whole body gradient and magnetic field coils are permanently mounted around the bore of the magnetic resonance imager. Additional gradient and RF coils are inserted into the bore. An RF shield is provided at least between the inserted radio frequency coil and the adjacent portions of the fixed whole body radio frequency and gradient coils.

In accordance with a more limited aspect of the present invention, the inserted gradient and RF coils are quadrature coils. The quadrature axes of the gradient and RF coils are rotated 45° relative to each other to minimize capacitive coupling.

In accordance with another aspect of the present invention, an RF filter is provided between the gradient coil and the cables which connect the gradient coil amplifier and power supply with the gradient coils in order to prevent RF signals induced in the cables and associated equipment from reaching the gradient coils.

One advantage of the present invention is that it enables gradient and RF coil systems to be more compact.

Another advantage of the present invention is that it provides for highly efficient gradient and RF coils.

Another advantage of the present invention is that it enables standard MRI units to be adapted for echo planar imaging, other fast scan applications, diffusion imaging, and spectroscopy.

Another advantage of the present invention is that it enables MRI systems to be built more cost effectively.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
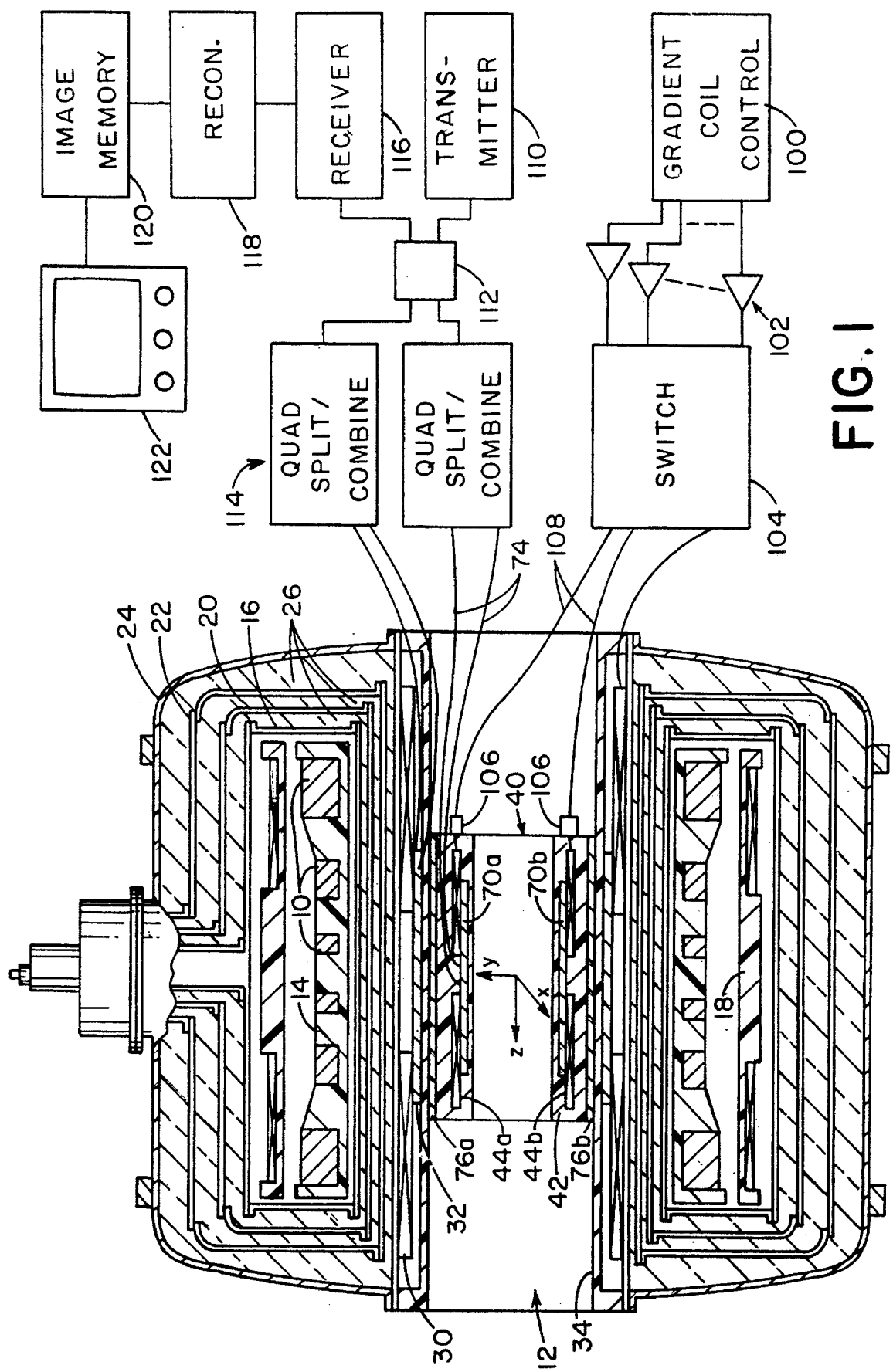
FIG. 1 is a vertical cross-sectional view of a superconducting magnetic resonance imaging apparatus with a biplanar gradient and RF coil assembly in accordance with the present invention.

With reference to FIG. 1, a plurality of superconducting main magnetic field coils 10 generate a generally uniform static magnetic field along a longitudinal or z-axis of a central bore 12. The superconducting coils are mounted on a dielectric former 14 and received in an annular, helium vessel 16. The helium vessel is filled with liquid helium to maintain the superconducting magnets at their superconducting temperature. A main magnetic field shield coil assembly 18 generates a magnetic field which opposes the fields generated by the main magnets 10 in regions surrounding the superconducting magnets 10.

The annular helium reservoir 16 is surrounded by a first cold shield 20 which is maintained at about 20° K. or less. A second cold shield assembly 22 is chilled to about 60°–70° K. or less. An outer vacuum vessel 24 encases the cold shields to define a vacuum reservoir therearound. Layers of mylar insulation 26 are arranged between the vacuum vessel, the cold shields, and the helium reservoir.

A circularly cylindrical, whole body gradient coil assembly 30 is mounted on a circularly cylindrical dielectric former and mounted within the bore 12. A circularly cylindrical, whole body RF coil 32 is mounted on a circularly cylindrical dielectric former and mounted within the bore 12. A circularly cylindrical dielectric cosmetic sleeve 34 shields the RF and gradient coils from view and protects them from damage.

Figure 2:
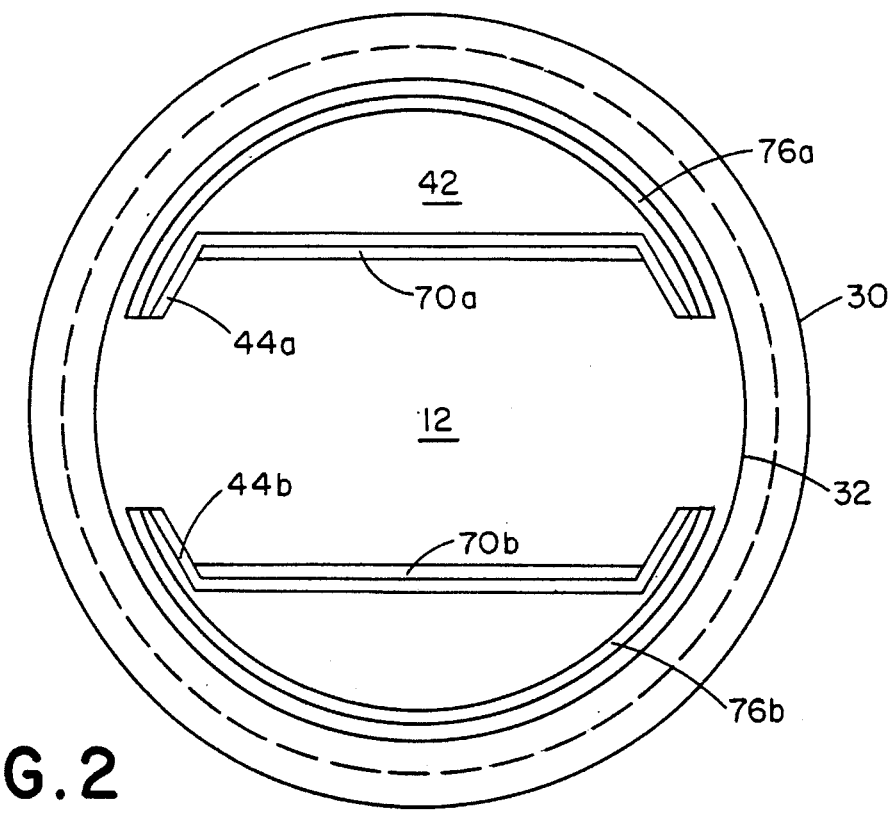
FIG. 2 is a diagrammatic end view of the bore, whole body RF and gradient coils, and an insertable RF and gradient coil assembly.

With continuing reference to FIG. 1 and further reference to FIG. 2, a biplanar gradient and RF coil assembly 40 is slidably received within the bore 12. The biplanar RF and gradient coil assembly 40 includes a dielectric guide assembly 42 which is slidably received within the bore to position the biplanar gradient and RF coil assembly accurately and stably. A biplanar gradient coil assembly 44 includes a pair of gradient coils 44a, 44b.

Figure 3:
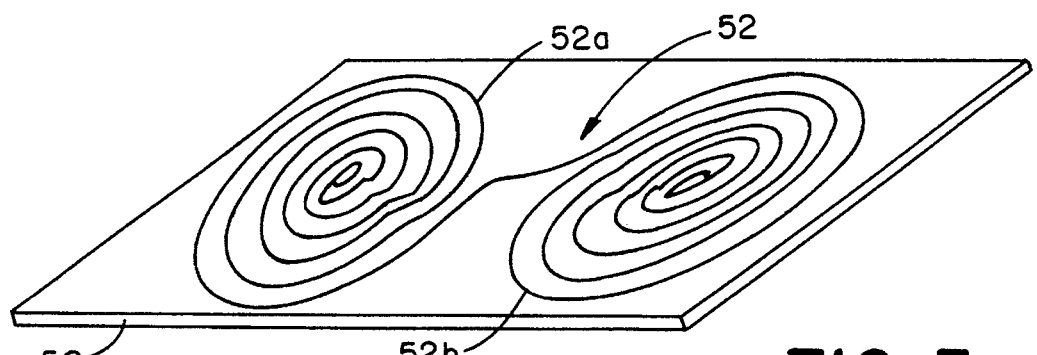
FIG. 3 is a perspective view of a gradient coil assembly in accordance with the present invention.
Figure 4:
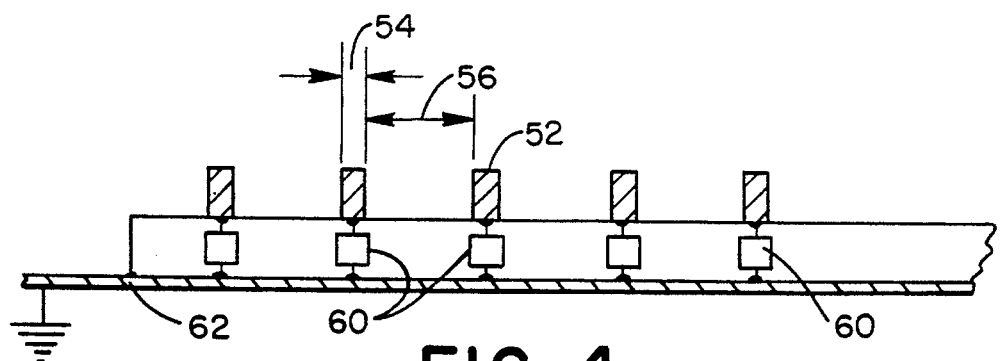
FIG. 4 is a sectional view through the gradient coil assembly of FIG. 3.

With reference to FIGS. 3 and 4, each of the gradient coils include a planar former 50 of a low dielectric material with a dielectric constant below 4.0. The gradient coil includes an electrical conductor 52 wound in spirals 52a and 52b of opposite orientation. The conductors each have a relatively narrow width 54 as compared with an intra conductor spacing 56. The conductors have sufficient height to accommodate the necessary current flows to generate the gradient. By making the conductors relatively narrow, with relatively wide RF windows in between, capacitive coupling with the RF coil is minimized. Mounting the conductors on a low dielectric former, assists in shielding the gradient coils from the RF signal further reducing coupling. In the preferred embodiment, the intra conductor spacing 56 is at least three times the conductor width 54. In some instances, the low dielectric material, the narrow conductor width, and the large RF windows along with a relatively high inductive value of the gradient coil itself, function as an RF choke preventing significant RF signals from being maintained in the gradient coil.

When necessary and to ensure the absence of radio frequency signals in the gradient coil, a means is provided for inhibiting RF currents, particularly in the MHz range, from flowing along the wires 52 of the gradient coil. In the embodiment illustrated in FIG. 4, the means for inhibiting RF current flow through the gradient coil includes a filter means 60 connected between the coil conductors 52 at frequent intervals and ground. Each of the filters is a high pass or band pass filter which passes radio frequency signals to a ground strip 62 and blocks the passage of kHz range gradient signals. In the preferred embodiment, the filter assembly 60 is a high pass filter which passes currents above 5 MHz and blocks those below 5 MHz.

Figure 5:
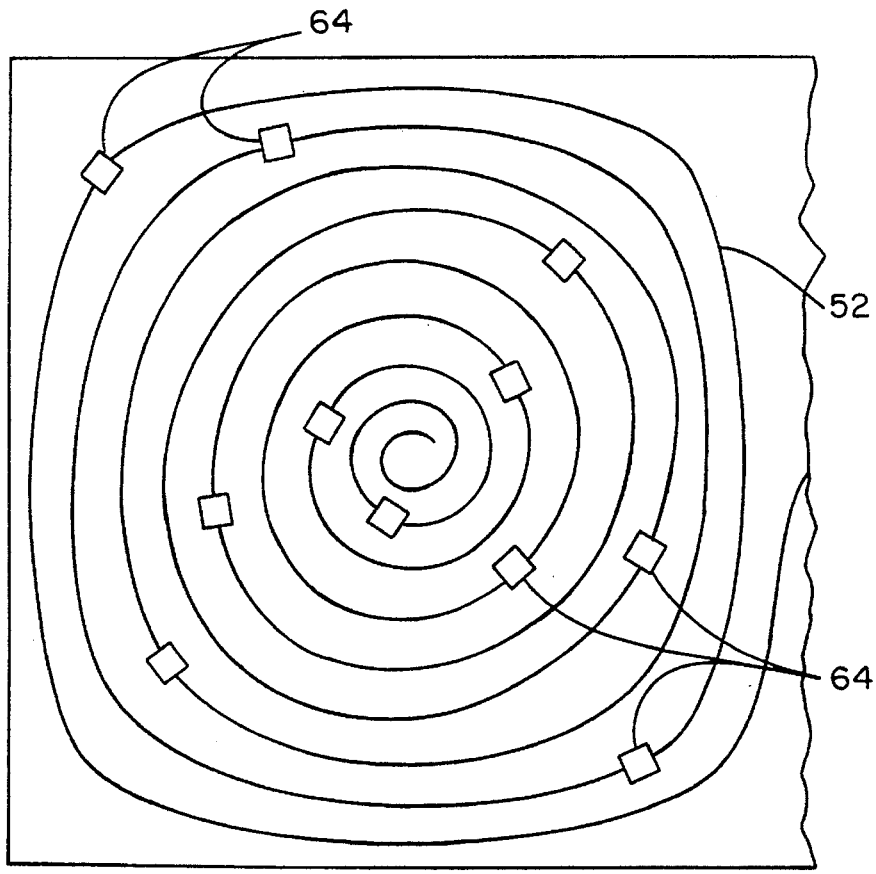
FIG. 5 is an alternate embodiment of a gradient coil assembly in accordance with the present invention.

With reference to FIG. 5, the means for inhibiting radio frequency current flow through the gradient coils includes a plurality of parallel resonance tank circuits 64. The parallel resonance tank circuits are preferably band reject filters which pass signals except the NMR frequency signals. The parallel resonance tank circuits interrupt the gradient coil assembly at a multiplicity of points to block sustained radio frequency current flow therethrough.

Figure 6:
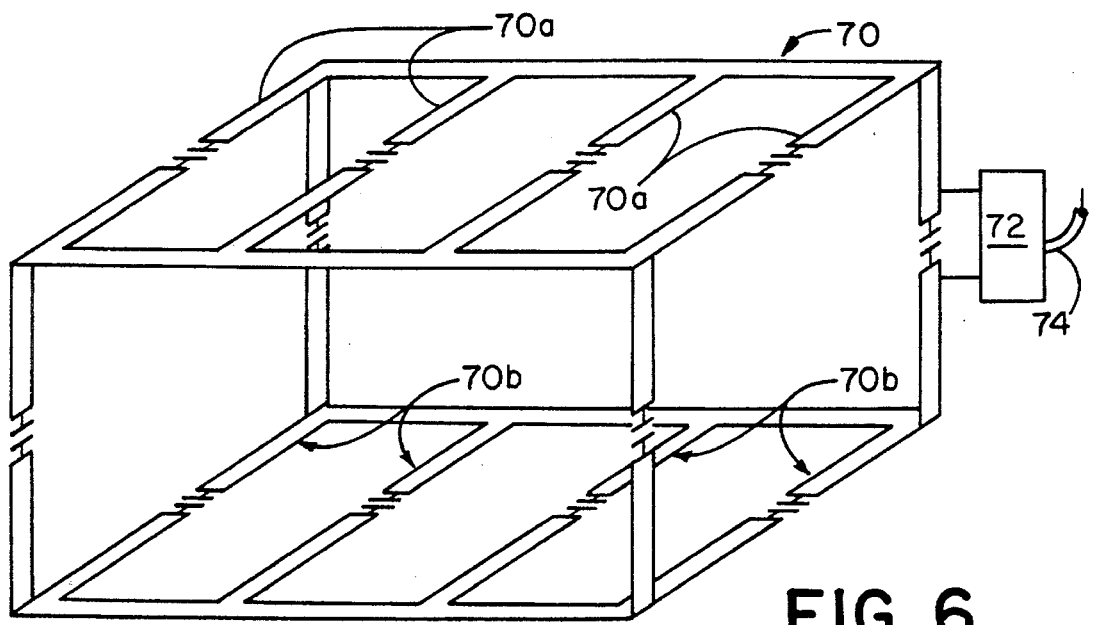
FIG. 6 is a perspective view of a biplanar RF coil assembly in accordance with the present invention.

With reference again to FIG. 2, and further reference to FIG. 6, the biplanar coil assembly 40 further includes a biplanar RF coil 70 including RF coil portions 70a and 70b. In the preferred embodiment, RF coil 70a is mounted to the reverse side of the dielectric former 50 from the gradient coil windings 52 or on the like low dielectric former which is bonded to the dielectric former 50. In this manner, the alignment of the RF and gradient coils is mechanically fixed to ensure a constant resonance frequency in the RF coil. Preferably, the RF and gradient coils are fixed with their respective geometric centers aligned. With this alignment, the orthogonality between the gradient coils and the RF coils serves to reduce coupling. Moreover, this alignment enables the most linear region of the gradient coils and the most homogeneous volume of the magnet bore to be used.

Each of the planar portions 70a, 70b of the biplanar RF coil include a plurality of conductive strips which extend parallel to the z or longitudinal axis of the bore. Electrical connectors are provided for connecting the ends of the strips together and for connecting the strips of the two planes together. Means are provided to assure that a uniform current flows through each of the strips at the selected RF frequency. In the preferred embodiment, this means is a reactive load, specifically a capacitor whose size is selected relative to the physical dimensions of the strip and the selected radio frequency such that the same magnitude current flows through each of the strips aligned with the z-axis. Similarly, reactances, preferably capacitances, are interposed between the upper coil portion 70a and the lower coil portion 70b to assure that the currents flowing through each of the planar sections are equal and opposite. A coupling circuit 72 connects the biplanar coil assembly with an RF cable 74.

With reference to FIG. 2, shield coil segments 76a and 76b are mounted between the RF coil sections 70a and 70b, and the surrounding whole body gradient coil 30 and whole body RF coil 32. The shield coil segments 76a and 76b are mounted as far from the RF coil segments 70a and 70b as physically possible within the constraints of the bore.

Figure 7:
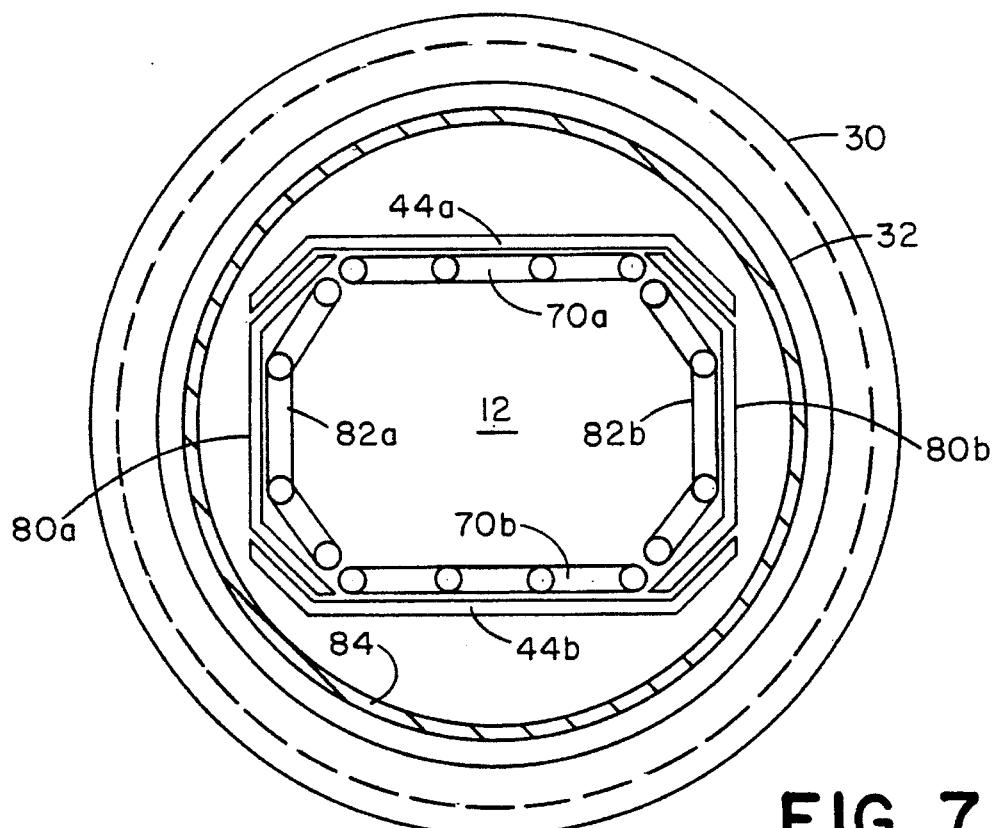
FIG. 7 is a diagrammatic end view of the bore with an alternate, quadrature embodiment of the insertable RF and gradient coil assembly; and, FIG. 8 is a diagrammatic end view of another alternate quadrature embodiment of the insertable coil assembly in which the RF and gradient quadrature coils are offset by 45° relative to each other.

With reference to FIG. 7, a second biplanar gradient coil 80, including gradient coil sections 80a and 80b are mounted 90° offset around the z-axis from gradient coils 44a and 44b. In this manner, one of the biplanar gradient coil assemblies generate gradients in an x-direction, and the other generates gradients in the y-direction. For quadrature detection, a second radio frequency coil assembly 82 including sections 82a and 82b are mounted with gradient coil sections 80a and 80b. The second pair of RF coil sections again preferably include a plurality of strips extending parallel to the z-axis with capacitors or other means to control the current flow at the selected radio frequency therethrough for uniformity of transmission and reception of radio frequency signals from the examination region. A shield coil 84 surrounds the insertable assembly to shield the whole body gradient coil 30 and the whole body RF coil 32 from the radio frequency fields. The shield coil 84 is disposed as far from the RF coil sections 70, 80 as is physically possible within the physical constraints of the bore 12.

Figure 8:
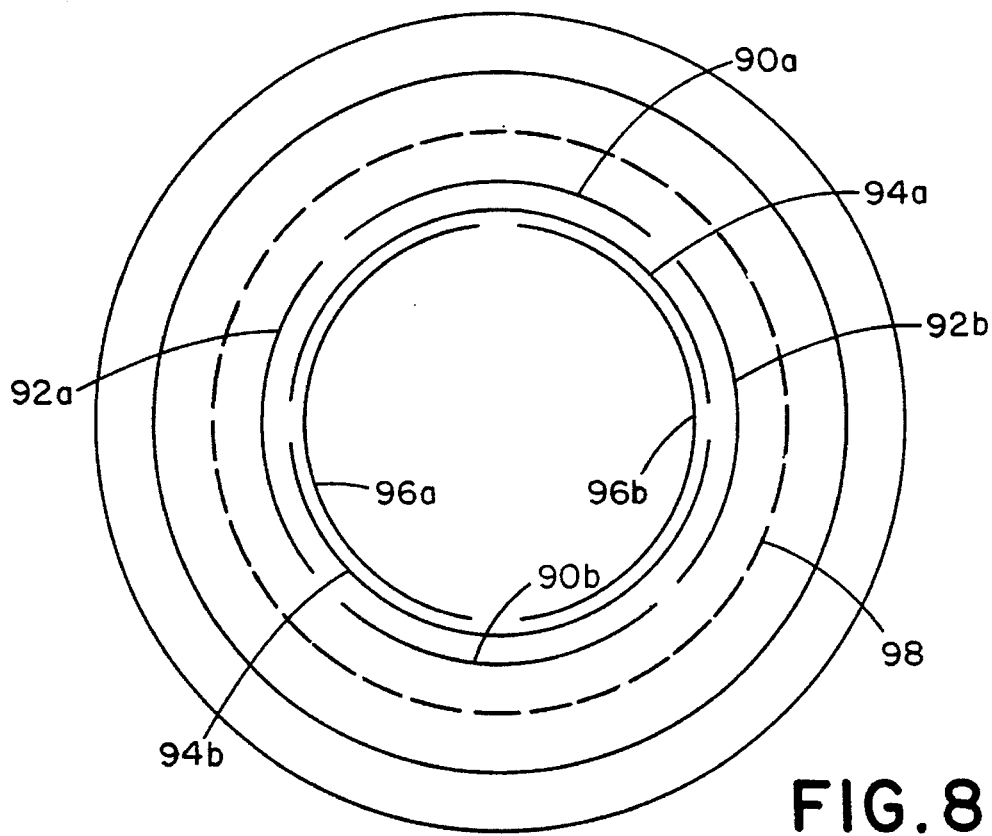

With reference to FIG. 8, the gradient and RF coils can have a cylindrical, elliptical, or other (x,y) cross-section. In the circular cross-section illustrated in FIG. 8, gradient coil sections 90a, 90b and 92a, 92b apply gradient coils along orthogonal axes. More specifically, coil pair 90a, 90b is supplied with a gradient current to generate a gradient field in one direction; gradient coils 92a, 92b are supplied with current pulses to generate gradient fields in an orthogonal direction. Alternately, current may be split between coil pairs 90a, 90b and 92a, 92b in order to rotate the axes. In the preferred embodiment, the axes is rotated 45° by applying current of substantially equal magnitude to all four gradient current sections. The two orthogonal gradients are defined by changing the relative polarity of the currents.

A first pair of RF coil segments 94a, 94b are mounted in a position rotated 45° relative to the gradient coil assemblies in order to minimize coupling. A second pair or RF coil assemblies 96a, 96b is mounted 90° rotated relative to the first RF coil pair 94a, 94b for quadrature detection. A conventional type shield coil 98 is mounted around the bore to isolate the inserted gradient and RF coils from the fixed whole body RF and gradient coils.

It is to be appreciated that the present invention may be used with other insertable or fixed RF and. gradient coil combinations. For example, the present invention may be used with the fixed, whole body RF coil and one or more of the whole body gradient coils. That is, the present invention may be used to prevent coupling of the RF coil with some of the gradient coils while a conventional shield prevents coupling of the RF coil with other larger radius gradient coils.

With reference again to FIG. 1, in operation, a gradient coil control means 100 controls an array of gradient amplifiers 102 to supply appropriate current pulses to one of the insertable gradient coil assembly 44 and the whole body gradient coil assembly 30. More specifically, a switching means 104 selectively disconnects the current amplifiers from the whole body gradient coils 30 when the insertable coil assembly 40 is inserted into the bore. RF filters 106 are connected between each gradient coil portion of the insertable gradient coil assembly and the cable 108 connecting it with the switch 104. The RF filters prevent RF signals which are induced in the connecting cable and associated circuitry from reaching the insertable gradient coil.

A radio frequency transmitter 110 generates radio frequency signals which are conveyed by a switching means 112 through a quadrature splitter/combiner 114 to one of (1) the whole body radio frequency coils 32 and (2) the insertable radio frequency coils 70a, 70b, 82a, 82b. The switching means 112 also connects the selected one of the radio frequency coils with a receiver 116 to supply received magnetic resonance signals thereto. The receiver, preferably a digital receiver, demodulates the magnetic resonance signals emanating from the examination region and produces a series of digital views therefrom. An image reconstruction means 118 performs a two-dimensional inverse Fourier transform or other conventional image reconstruction technique to reconstruct the plurality of views into an image representation which is stored in an image memory 120. The image memory 120 is connected with a video monitor 122 which selectively displays man-readable images of the image representations in the image memory 120.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
   a main magnetic field means for generating a main magnetic field through an examination region;
   a gradient field coil for generating magnetic field gradients across the examination region;
   a gradient field coil power supply for supplying current pulses to the gradient field coil to cause the generation of magnetic field gradient pulses;
   a radio frequency coil mounted closely adjacent the gradient coil and the examination region for selectively transmitting radio frequency signals of a preselected frequency into the examination region and receiving radio frequency magnetic resonance signals of substantially the preselected frequency from the examination region, the transmitted radio frequency signals tending to induce radio frequency eddy current loops of the preselected frequency within the gradient field coil, which eddy current loops transmit eddy radio frequency signals of the preselected frequency after the radio frequency coil has stopped transmitting the radio frequency signals into the examination region and while the radio frequency coil is receiving the magnetic resonance signals from the examination region;
   the gradient field coil being configured such that eddy current loops of said preselected radio frequency are prevented from being induced in and flowing through the gradient field coil, such that the eddy current loops of the preselected radio frequency are not supported by the gradient field coil to prevent the eddy radio frequency signals from being transmitted by the gradient field coil and received by the radio frequency coil superimposed on the received magnetic resonance signals;
   a radio frequency transmitter for selectively transmitting radio frequency signals of said preselected radio frequency to the radio frequency coil;
   a radio frequency receiver for receiving and demodulating radio frequency signals of substantially said preselected radio frequency from the radio frequency coil;
   a reconstruction means for reconstructing an image representation from the received and demodulated radio frequency signals.

2. The apparatus as set forth in claim 1 wherein the gradient field coil is mounted on a dielectric substrate which has a dielectric constant less than 4.0, the dielectric substrate being disposed between the gradient field coil and the radio frequency coil.

3. The apparatus as set forth in claim 2 wherein the gradient field coil includes electrical conductors mounted on the dielectric substrate, which electrical conductors are spaced such that adjacent conductor portions are spaced apart at least three times the conductor width.

4. The apparatus as set forth in claim 1 wherein the gradient field coil includes electrical conductors having a conductor width, the electrical conductors being mounted on the dielectric substrate, which electrical conductors are spaced such that adjacent conductor portions are spaced apart at least three times the conductor width to define RF windows, whereby the relatively narrow conductor width and the wide RF windows minimize capacitive coupling between the radio frequency and gradient coils.

5. The apparatus as set forth in claim 4 further including a filter means connected with the electrical conductors for allowing the conductors to support kHz frequency signals and for inhibiting the conductors from supporting currents of the preselected radio frequency.

6. A magnetic resonance imaging apparatus comprising:
   a main magnetic field means for generating a main magnetic field through an examination region;
   a gradient field coil for generating magnetic field gradients across the examination region, the gradient field coil including:
   electrical conductors; and
   filters within the gradient field coil connected among the electrical conductors, which filters permit the conductors to conduct kilohertz frequency currents and which inhibit the conductors from conducting radio frequency currents;
   a gradient field coil power supply for supplying kilohertz frequency current pulses to the first gradient field coil to cause the generation of magnetic field gradient pulses;
   a radio frequency coil mounted closely adjacent the first gradient coil and the examination region for selectively transmitting radio frequency signals of a preselected radio frequency and receiving radio frequency signals of substantially the preselected radio frequency from the examination region, which radio frequency signals tend to induce radio frequency eddy currents of the preselected frequency in the electrical conductors of the gradient field coils, the filters inhibit the radio frequency eddy currents of said preselected radio frequency from being conducted through the electrical conductors such that the radio frequency eddy currents are not supported by the gradient field coil;
   a radio frequency transmitter for selectively transmitting radio frequency signals of said preselected radio frequency to the radio frequency coil;
   a radio frequency receiver for receiving and demodulating radio frequency signals of substantially said preselected radio frequency from the radio frequency coil;
   a reconstruction means for reconstructing an image representation from the received and demodulated radio frequency signals.

7. A magnetic resonance imaging apparatus comprising:

a main magnet for generating a main magnetic field through an examination region;

a gradient field coil for generating magnetic field gradients across the examination region;

a gradient field coil power supply for supplying kHz range current pulses to the gradient field coil to cause the generation of magnetic field gradient pulses;

a radio frequency coil mounted closely adjacent the gradient coil and between the gradient coil and the examination region for selectively transmitting radio frequency signals of a preselected frequency and receiving radio frequency signals of substantially the preselected frequency from the examination region;

a plurality of frequency selective impedances connected at intervals along the gradient field coil between the gradient field coil and ground, each of the frequency selective impedances passing the radio frequency signals to ground and blocking the passage of the kHz range current pulses such that the kHz range current pulses are propagated along the gradient field coil and any radio frequency signals are shorted by the frequency selective impedances to ground;

a radio frequency transmitter for selectively transmitting radio frequency signals of said preselected radio frequency to the radio frequency coil;

a radio frequency receiver for receiving and demodulating radio frequency signals of substantially said preselected radio frequency from the radio frequency coil;

a reconstruction means for reconstructing an image representation from the received and demodulated radio frequency signals.

8. A magnetic resonance imaging apparatus comprising:

main magnetic field coils which generate a main magnetic field through an examination region, the main magnetic field being generated longitudinally along a central bore of a main magnetic field magnet;

a whole body gradient and radio frequency coil assembly surrounding the bore;

an insertable gradient field coil for generating magnetic field gradients across the examination region;

a gradient field coil power supply for electively supplying current pulses to the insertable gradient field coil and the whole body gradient and radio frequency coil assembly to cause the generation of magnetic field gradient pulses;

an insertable radio frequency coil mounted closely adjacent the insertable gradient coil and between the insertable gradient coil and the examination region for selectively transmitting radio frequency signals of a preselected frequency and receiving radio frequency signals of substantially the preselected frequency from the examination region, the insertable gradient field coil and the insertable radio frequency coil being selectively insertable into and removable from the bore;

the insertable gradient field coil being configured such that eddy currents of said preselected radio frequency are not supported by the insertable gradient field coil;

a radio frequency transmitter for selectively transmitting radio frequency signals of said preselected radio frequency to the insertable radio frequency coil and the whole body gradient and radio frequency coil assembly;

a radio frequency receiver for receiving and demodulating radio frequency signals of substantially said preselected radio frequency from the insertable radio frequency coil and the whole body gradient and radio frequency coil assembly;

a reconstruction processor for reconstructing an image representation from the received and demodulated radio frequency signals.

9. The apparatus as set forth in claim 8 further including a radio frequency shield between the insertable gradient field coil and the whole body gradient and radio frequency coil assembly for preventing radio frequency signals of the preselected radio frequency from the radio frequency coil from reaching the whole body gradient and radio frequency coil assembly.

10. The apparatus as set forth in claim 9 wherein the insertable gradient field coil includes at least four gradient coil segments for generating gradient magnetic fields along a pair of orthogonal axes and wherein the insertable radio frequency coil is a quadrature detection coil for detection along orthogonal quadrature detection axes, the quadrature detection axes being offset from the axes of the insertable gradient field coil.

11. The apparatus as set forth in claim 9 wherein the insertable gradient field coil includes a pair of parallel, planar coil sections.

12. A magnetic resonance imaging apparatus comprising:

an array of annular magnets for generating a substantially uniform, static magnetic field through a central bore thereof;

a whole body gradient magnetic field coil assembly mounted around the central bore for selectively generating gradient magnetic fields within the central bore;

a whole body radio frequency coil mounted around the central bore adjacent the whole body gradient magnetic field coil assembly for selectively generating radio frequency signals in and receiving radio frequency signals from the central bore;

a radio frequency transmitter which is selectively connectable with the whole body radio frequency coil for supplying radio frequency signals of a selected frequency range thereto;

an insertable coil assembly including an insertable gradient field coil and an insertable radio frequency coil which are mounted in close proximity to each other without an intervening radio frequency shield between the insertable gradient field coil and the insertable radio frequency coil, the radio frequency transmitter being selectively connectable with the insertable radio frequency coil, the insertable gradient field and radio frequency coils being configured such that the insertable gradient field coil has high impedance at the selected radio frequency range and such that capacitive coupling between the insertable radio frequency and gradient field coils is minimized;

a radio frequency receiver which is selectively connectable with the whole body radio frequency coil assembly and the insertable radio frequency coil for receiving and demodulating radio frequency magnetic resonance signals of substantially the selected radio frequency therefrom; and, a reconstruction means for reconstructing an image representation from the received, demodulated magnetic resonance signals.

13. The apparatus as set forth in claim 12 wherein a dielectric former having a dielectric constant of less than 4.0 is disposed between and supports at least one of the insertable radio frequency and gradient magnetic field coils.

14. The apparatus as set forth in claim 12 wherein the insertable gradient field coil includes electrical conductors which are interconnected with a plurality of filters distributed therealong which inhibit the electrical conductors from supporting currents of said selected radio frequency range and freely support currents in a kHz range for generating the magnetic field gradients.

15. The apparatus as set forth in claim 12 further including an RF filter connected with the insertable gradient field coil and interconnected between the insertable gradient field coil and an electrical cable connecting the insertable gradient field coil with a gradient field control for preventing signals of said selected radio frequency from being transmitted from the cable to the insertable gradient field coil.

16. The apparatus as set forth in claim 12 wherein the insertable gradient field coil includes a first pair of coil portions for generating magnetic field gradients along a first axis and a second pair of gradient coil portions for generating magnetic field gradients along a second axis orthogonal to the first axis and wherein the insertable radio frequency coil is a quadrature detection radio frequency coil which is oriented for quadrature detection along quadrature detection axes which are rotated about 45° relative to the first and second orthogonal axes.

17. The apparatus as set forth in claim 12 wherein the insertable radio frequency and gradient magnetic field coils include a pair of gradient coil portions which are mounted on parallel planes on opposite sides of an examination region and a pair of radio frequency coil portions which are mounted on parallel planes on opposite sides of the examination region and further including a radio frequency shield mounted around the insertable coil assembly between the insertable coil assembly and the whole body radio frequency and gradient magnetic field coil assemblies.

18. The apparatus as set forth in claim 6 wherein the filters are mounted intermittently along the electrical conductors to block the flow of the radio frequency eddy currents of the preselected radio frequency along the electrical conductors while permitting the flow of the kilohertz frequency current pulses along the conductors, whereby radio frequency current loops of the preselected radio frequency are not supported within the gradient field coil.

19. The apparatus as set forth in claim 6 wherein the filters are connected between ground and intermediate points along the electrical conductors, the filters selectively shorting the radio frequency eddy currents to ground while blocking the flow of the kilohertz frequency current pulses to ground such that the electrical conductors support the kilohertz frequency currents.

20. The apparatus as set forth in claim 10 wherein the insertable radio frequency coil is closely adjacent a nearest most pair of the gradient coil segments without a radio frequency shield therebetween.

21. The apparatus as set forth in claim 12 wherein the insertable gradient field coil includes distributed electrical conductor windings having at each point therealong a width and a spacing between adjacent windings, the spacing being sufficiently larger than the width that capacitive coupling between the adjacent windings is reduced sufficiently to inhibit currents in the radio frequency range from flowing through said capacitive couplings between the adjacent windings.

22. The apparatus as set forth in claim 12 wherein the insertable gradient field coil has a plurality of impedance means distributed therealong for inhibiting currents in the radio frequency range from flowing within the insertable gradient field coil.

23. A magnetic resonance imaging apparatus comprising:

a main magnet which generates a main magnetic field through an examination region;

a gradient field coil which generates magnetic field gradients across the examination region;

a gradient field coil power supply which supplies kHz range current pulses to the gradient field coil to cause the generation of magnetic field gradient pulses;

a radio frequency coil mounted closely adjacent the gradient coil and between the gradient coil and the examination region for selectively transmitting radio frequency signals in a preselected frequency range and receiving radio frequency signals from the examination region;

a radio frequency filter system for inhibiting the radio frequency signals from flowing in the gradient field coil, the radio frequency filter system including:
  (i) an RF filter connected adjacent the gradient field coil for passing the kHz range current pulses and blocking receipt of radio frequency signals from an electrical connector extending from the gradient field coil power supply to the gradient field coil such that radio frequency signals are blocked from reaching the gradient field coil;
  (ii) a plurality of frequency selective filters connected at intervals along the gradient field coil, each of the frequency selective filters permitting the kHz range current pulses to flow along the gradient field coil and inhibiting the gradient field coil from carrying the radio frequency signals;

a radio frequency transmitter for selectively transmitting the radio frequency signals to the radio frequency coil;

a radio frequency receiver for receiving and demodulating the radio frequency signals from the radio frequency coil;

a reconstruction means for reconstructing an image representation from the received and demodulated radio frequency signals.

* * * * *